US005530339A

United States Patent [19]

Macrae et al.

[11] Patent Number: 5,530,339

[45] Date of Patent: Jun. 25, 1996

[54] OUTPUT CURRENT DRIVER WITH AN ADAPTIVE CURRENT SOURCE

[75] Inventors: Calum Macrae, Glasgow; Karl Edwards, Erskine, both of United Kingdom

[73] Assignee: National Semiconductor Corporation, Santa Clara, Calif.

[21] Appl. No.: 250,057

[22] Filed: May 27, 1994

[51] Int. Cl.[6] .................... H03K 17/00

[52] U.S. Cl. .................... 323/312; 327/551; 327/553

[58] Field of Search .................... 323/312–316; 327/551–553

[56] References Cited

U.S. PATENT DOCUMENTS

| | | | |
|---|---|---|---|
| 4,042,480 | 8/1977 | Chan | 307/270 |
| 4,567,426 | 1/1986 | Van de Plassche et al. | 323/315 |
| 4,804,904 | 2/1989 | Katakura | 323/312 |

FOREIGN PATENT DOCUMENTS

| | | |
|---|---|---|
| 0511007 | 10/1992 | European Pat. Off. . |
| 0607789 | 7/1994 | European Pat. Off. . |

OTHER PUBLICATIONS

Harris HA-2700/2704/2705 Data Sheet.

SGS Thompson L2720/2/4 Data Sheet, Jun. 1988.

*Primary Examiner*—Peter S. Wong

*Assistant Examiner*—Aditya Krishnan

*Attorney, Agent, or Firm*—Limbach & Limbach

[57] ABSTRACT

A current driver utilizes a variable current source and a pair of comparison stages to provide a pair of output transistors with a low quiescent current and the ability to quickly satisfy the current demands of an inductive load. When the voltage input to the current driver is approximately equal to the voltage across the load, the variable current source is set at a minimum value, thereby providing the output transistors with the low quiescent current. When the input voltage varies from the voltage across the load, the current flowing through the output transistors begins to change so that one of the output transistors has a greater current flow, depending on whether the driver is sourcing current to or sinking current from the load. One of the two comparison stages, depending on whether current is being sourced to or sunk from the load, senses the change in the current flowing through the output transistors, and varies the variable current source so that the output transistor which is providing current to or sinking current from the load can satisfy the current demands of the load, and so that the remaining output transistor does not turn off. By preventing the transistor which is not in control of the load from turning off, the current driver is able to quickly respond to changes in the demands of the load.

18 Claims, 2 Drawing Sheets

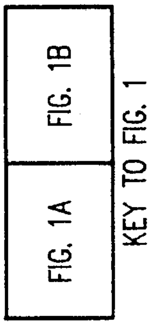
FIG. 1B
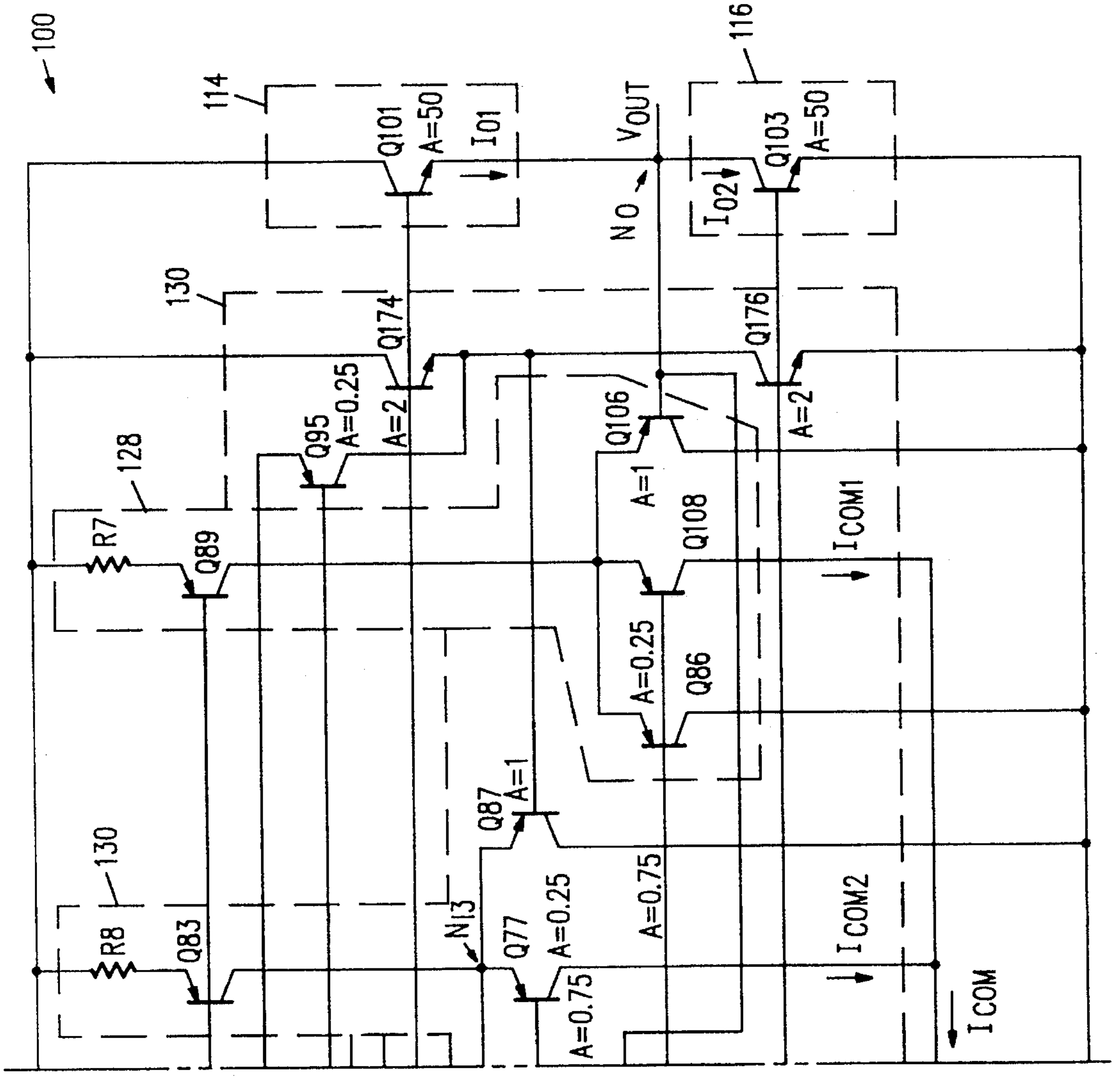

OUTPUT CURRENT DRIVER WITH AN ADAPTIVE CURRENT SOURCE

BACKGROUND OF THE INVENTION

1. Field of the Invention.

The present invention relates to current drivers and, in particular, to an adaptive-output current driver.

2. Discussion of the Related Art.

A current driver is a circuit that sources current to and sinks current from a load so that the voltage across the load tracks the movement of an input voltage. Current drivers are commonly classified by the maximum mount of current that can be driven by the driver, and by the minimum mount of current, commonly known as the quiescent current, that will be consumed by the driver when there is little or no demand for current.

The maximum current that can be sourced by a driver is usually defined by the size of the output transistor which is sourcing the current. Thus, as the size of the output transistor increases, the maximum amount of current that can be sourced by the output transistor also increases.

The problem, however, is that the size of the output transistor also typically defines the minimum amount of current that will be consumed by the driver. Thus, as the size of the output transistor increases, the minimum amount of current that will be consumed by the driver also increases, thereby increasing the power consumed by the driver under quiescent conditions.

As a result, a typical current driver will have a relatively large quiescent current when the maximum demand for current is relatively high, as with an inductive load, and will only have a relatively small quiescent current when the maximum demand for current is relatively small. Thus, there is a need for a current driver which can quickly source a large current when there is a heavy demand for current, but which will also consume only a small quiescent current when there is little or no demand for current.

SUMMARY OF THE INVENTION

The present invention provides an adaptive-output current driver that utilizes an adaptive current source and a pair of comparison stages to quickly satisfy the current demands of a high-current load, such as an inductive load, and to provide a low quiescent current when there is little or no demand for current.

An adaptive-output current driver in accordance with the present invention includes an input stage, a first output stage, and a second output stage. The input stage changes the magnitude of a first intermediate voltage at a first intermediate node, and the magnitude of a second intermediate voltage at a second intermediate node in response to changes in the magnitude of an input voltage. The input stage also sources a first bias current into the first intermediate node and a second bias current into the second intermediate node. The magnitude of the first bias current and of the second bias current vary in response to changes in the magnitude of a control current and the input voltage. The first output stage, which is connected to the first intermediate node, sources a first output current to an output node. The first output stage also varies the magnitude of the first output current in response to the difference between the first intermediate voltage and an output voltage at the output node, and the magnitude of the first bias current. The difference between the first intermediate voltage and the output voltage defines a first difference voltage. The second output stage, which is connected to the second intermediate node, sinks a second output current from the output node. The magnitude of the second output current varies in response to the difference between the second intermediate voltage and the output voltage, and the magnitude of the second bias current. The difference between the second intermediate voltage and the output voltage defines a second difference voltage. The current driver also includes a current control stage and a reference stage. The current control stage sinks the control current from the input stage, and sets the magnitude of the control current in response to the magnitude of a comparison current. The reference stage, which is also connected to the first intermediate node, generates a reference stage voltage at a reference node in response to the first bias current, the first intermediate voltage, and a reference current. The difference between the first intermediate voltage and the reference stage voltage defines a third difference voltage. In the present invention, a first comparison stage sources a first portion of the comparison current, and compares the first difference voltage to the third difference voltage. The first comparison stage varies the magnitude of the first portion of the comparison current when the first difference voltage differs from the third difference voltage, and the magnitude of the second output current is greater than a first predetermined level. Similarly, a second comparison stage sources a second portion of the comparison stage, and compares the second difference voltage to the third difference voltage. The second comparison stage varies the magnitude of the second portion of the comparison current when the second difference voltage differs from the third difference voltage, and the magnitude of the first output current is greater than a second predetermined level. The comparison current is defined by the first and second portions of the comparison current.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A and 1B are schematic diagrams illustrating an adaptive-output current driver 100 in accordance with the present invention.

DETAILED DESCRIPTION OF THE INVENTION

Figure 1A:
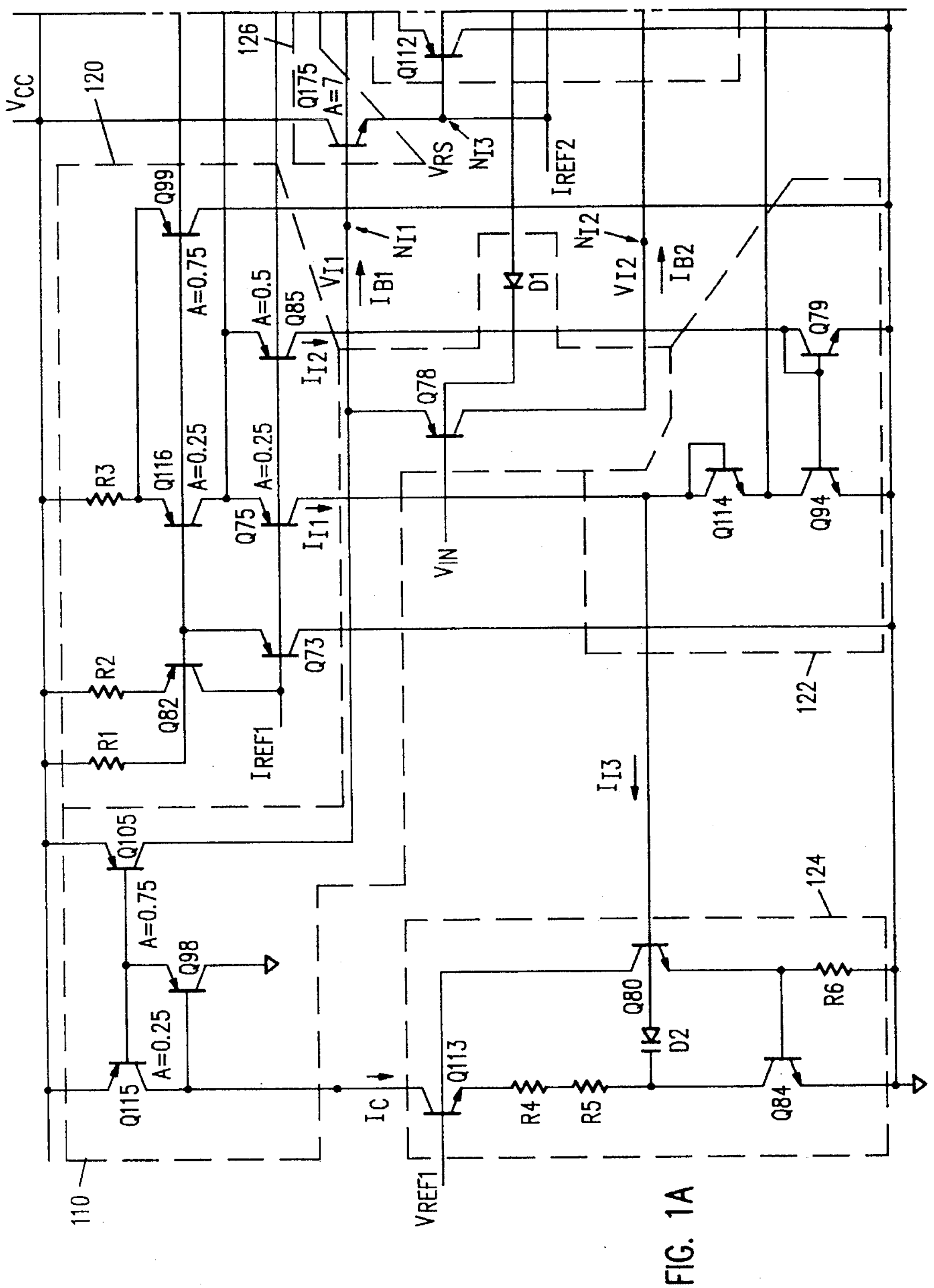

FIGS. 1A and 1B show an adaptive-output current driver 100 in accordance with the present invention. As described in greater detail below, the adaptive-output current driver 100 utilizes an adaptive current source and a pair of comparison stages to provide a low quiescent current (e.g., 1 mA/Beta) when there is little or no demand for current, and a substantially larger current (e.g., 32 mA/Beta) which can be quickly increased when there is a significant demand for current.

As shown in FIGS. 1A and 1B, driver 100 includes an input stage 110 that changes the magnitude of a first intermediate voltage $V_{I1}$ at a first intermediate node $N_{I1}$, and the magnitude of a second intermediate voltage $V_{I2}$ at a second intermediate node $N_{I2}$ in response to changes in the magnitude of an input voltage $V_{IN}$.

In addition, input stage 110, which includes p-channel transistors Q78, Q115, Q105, and Q98, and diode D1, also sources a first bias current $I_{B1}$ into the first intermediate node $N_{I1}$ and a second bias current $I_{B2}$ into the second intermediate node $N_{I2}$. The magnitudes of the first bias current $I_{B1}$ and of the second bias current $I_{B2}$ vary in response to changes in the magnitude of a control current $I_C$ flowing through transistor Q115 and the input voltage $V_{IN}$.

In operation, the control current $I_C$ is sunk through transistor Q115. The magnitude of the control current $I_C$ flowing through transistor Q115 is then mirrored by transistor Q105, which sources the first bias current $I_{B1}$, to set the magnitude of the first bias current $I_{B1}$. Thus, by varying the magnitude of the control current $I_C$, the magnitude of the first bias current $I_{B1}$ can also be varied.

Transistor Q78 sources the second bias current $I_{B2}$ by sinking a portion of the first bias current $I_{B1}$. As described in greater detail below, when the input voltage $V_{IN}$ and an output voltage $V_{OUT}$ are approximately equal, the magnitudes of the first bias current $I_{B1}$ and the second bias current $I_{B2}$ are also approximately equal.

As the input voltage $V_{IN}$ begins to increase with respect to the output voltage $V_{OUT}$, the voltage across the emitter-base junction of transistor Q78 begins to decrease, thereby reducing the portion of the first bias current $I_{B1}$ which is sunk by transistor Q78. As a result, the magnitude of the first bias current $I_{B1}$ which is sourced into the first intermediate node $N_{I1}$ begins to increase, while the magnitude of the second bias current $I_{B2}$ which is sourced into the second intermediate node $N_{I2}$ begins to decrease. In addition, with less current flowing through transistor Q78, the voltage at the first intermediate node $N_{I1}$ begins to rise, while the voltage at the second intermediate node $N_{I2}$ begins to fall.

On the other hand, as the input voltage $V_{IN}$ begins to decrease with respect to the output voltage $V_{OUT}$, the voltage across the emitter-base junction of transistor Q78 begins to increase, thereby causing a greater portion of the first bias current $I_{B1}$ to be sunk by transistor Q78. As a result, the magnitude of the first bias current $I_{B1}$ which is sourced into the first intermediate node $N_{I1}$ begins to decrease, while the magnitude of the second bias current $I_{B2}$ begins to increase. In addition, with more current flowing through transistor Q78, the voltage at the first intermediate node $N_{I1}$ begins to fall, while the voltage at the second intermediate node $N_{I2}$ begins to rise.

As further shown in FIGS. 1A and 1B, driver 100 also includes a first output stage 114 that sources a first output current $I_{O1}$ to an output node $N_O$. In a typical application, the output node $N_O$ is connected to an inductive load which, in turn, is connected to ground. As a result, the output voltage $V_{OUT}$ at the output node $N_O$ represents the voltage across the load.

In addition, first output stage 114, which includes an n-channel transistor Q101, also varies the magnitude of the first output current $I_{O1}$ in response to the difference between the first intermediate voltage $V_{I1}$ and the output voltage $V_{OUT}$, and the magnitude of the first bias current $I_{B1}$. The difference between the first intermediate voltage $V_{I1}$ and the output voltage $V_{OUT}$ defines a first difference voltage. Thus, as shown in FIGS. 1A and 1B, the first difference voltage represents the voltage drop across the base-emitter junction of transistor Q101.

Similarly, a second output stage 116 sinks a second output current $I_{O2}$ from the output node $N_O$. Second output stage 116, which includes an n-channel transistor Q103 that is connected to transistor Q101 in a conventional push-pull configuration, varies the magnitude of the second output current $I_{O2}$ in response to the difference between the second intermediate voltage $V_{I2}$ and ground, and the magnitude of the second bias current $I_{B2}$. The difference between the second intermediate voltage $V_{I2}$ and ground defines a second difference voltage. Thus, as also shown in FIGS. 1A and 1B, the second difference voltage represents the voltage drop across the base-emitter junction of transistor Q103.

In the operation of the circuit shown in FIGS. 1A and 1B, the first output current $I_{O1}$ is sourced into the output node $N_O$ by transistor Q101 while the second output current $I_{O2}$ is sunk from the output node $N_O$ by transistor Q103. The relative magnitudes of the first output current $I_{O1}$ and the second output current $I_{O2}$ are set by the magnitudes of the first and second bias currents $I_{B1}$ and $I_{B2}$, and the magnitudes of the first and second intermediate voltages $V_{I1}$ and $V_{I2}$.

As stated above, when the input voltage $V_{IN}$ and the output voltage $V_{OUT}$ are approximately equal, the magnitudes of the first bias current $I_{B1}$ and the second bias current $I_{B2}$ are also approximately equal. In addition, the magnitudes of the voltages across the base-emitter junctions of transistors Q101, Q103, and Q78 are approximately equal.

As a result, substantially all of the first output current $I_{O1}$ sourced by transistor Q101 is sunk as the second output current $I_{O2}$ by transistor Q103. When no current is being sourced to or sunk from the output node $N_O$, the magnitude of the first and second output currents $I_{O1}$ and $I_{O2}$ are reduced to quiescent levels. As stated above, the magnitudes of the first output current $I_{O1}$ and the second output current $I_{O2}$ are controlled by the magnitude of the first and second bias currents $I_{B1}$ and $I_{B2}$ which, in turn, are controlled by the magnitude of the control current $I_C$. Thus, when the input voltage $V_{IN}$ and the output voltage $V_{OUT}$ are approximately equal, the magnitude of the control current $I_C$ defines the quiescent level of the first and second output currents $I_{O1}$ and $I_{O2}$ in transistors Q101 and Q103, respectively.

One problem with inductive loads is that the current is 90° out of phase with the voltage. As a result, the peak current to the load occurs at zero volts. This, in turn, can cause cross-over distortion on the peaks and troughs of the voltage waveform when the load current changes signs. To prevent this, the quiescent level of the first and second output currents $I_{O1}$ and $I_{O2}$ must be set high enough to control the load when the first and second output currents $I_{O1}$ and $I_{O2}$ change sign.

As stated above, when the input voltage $V_{IN}$ increases with respect to the output voltage $V_{OUT}$, the magnitude of the first intermediate voltage $V_{I1}$ and the first bias current $I_{B1}$ begin to increase. At the same time, the magnitude of the second intermediate voltage $V_{I2}$ and the second bias current $I_{B2}$ begin to decrease. This, in turn, increases the voltage across the base-emitter junction of transistor Q101, thereby increasing the magnitude of the first output current $I_{O1}$. This also decreases the voltage drop across the base-emitter junction of transistor Q103, thereby decreasing the magnitude of the second output current $I_{O2}$. As a result, when the input voltage $V_{IN}$ increases with respect to the output voltage $V_{OUT}$, the first output stage 114 sources more current than can be sunk by the second output stage 116, thereby charging the load connected to the output node $N_O$.

On the other hand, as the input voltage $V_{IN}$ begins to decrease with respect to the output voltage $V_{OUT}$, the magnitude of the first intermediate voltage $V_{I1}$ and the first bias current $I_{B1}$ begin to decrease. At the stone time, the magnitude of the second intermediate voltage $V_{I2}$ and the second bias current $I_{B2}$ begin to increase. As a result, the first output stage 114 reduces the magnitude of the first output current $I_{O1}$, while the second output stage 116 increases the magnitude of the second output current $I_{O2}$. Thus, when the input voltage $V_{IN}$ decreases, the first output stage 114 sources less current than can be sunk by the second output stage 116, thereby discharging the load.

Driver 100 additionally includes a current control stage that sinks the control current $I_C$ from the input stage 110, and that sets the magnitude of the control current $I_C$ in response to the magnitude of a comparison current $I_{COM}$. As shown in FIGS. 1A and 1B, the current control stage includes a first current stage 120, a second current stage 122, and a third current stage 124.

First current stage 120 sources a first intermediate current $I_{I1}$ and a second intermediate current $I_{I2}$ in response to a first reference current $I_{REF1}$. As shown in FIGS. 1A and 1B, first current stage 120 includes p-channel transistors Q82, Q116, Q73, and Q99, which are configured as a conventional base-current compensated current mirror, as well as p-channel transistors Q75 and Q85.

In operation, the reference current $I_{REF1}$ is primarily sunk through transistor Q82. The magnitude of the current sunk through transistor Q82 is then mirrored by the collector currents of transistors Q116 and Q99. The emitter area of transistor Q99 is formed to be approximately three times the area of transistor Q116. As a result, the magnitude of the collector current sourced by transistor Q116 is approximately one-fourth the magnitude of the collector current sourced by transistor Q82.

Transistors Q75 and Q85 are then used to split the collector current sourced by transistor Q116. As shown in FIGS. 1A and 1B, transistor Q75 sources the first intermediate current $I_{I1}$, while transistor Q85 sources the second intermediate current $I_{I2}$. In the preferred embodiment, the emitter area of transistor Q75 is formed to be approximately one-half the area of transistor Q85. Thus, the magnitude of the second intermediate current $I_{I2}$ is approximately twice the magnitude of the first intermediate current $I_{I1}$.

Second current stage 122 sources a third intermediate current $I_{I3}$ in response to the first intermediate current $I_{I1}$, the second intermediate current $I_{I2}$, and the comparison current $I_{COM}$. In addition, second current stage 122 also varies the magnitude of the third intermediate current $I_{I3}$ in response to variations in the magnitude of the comparison current $I_{COM}$.

As also shown in FIGS. 1A and 1B, stage 122 includes n-channel transistors Q94 and Q79, which are configured as a conventional n-channel current mirror, and transistor Q114, which is configured as a diode. In operation, the second intermediate current $I_{I2}$ is sunk by transistor Q79. The magnitude of the second intermediate current $I_{I2}$ is then mirrored by the collector current of transistor Q94, which sinks the first intermediate current $I_{I1}$ and the comparison current $I_{COM}$. Since, as described above, the magnitude of the first intermediate current $I_{I1}$ is approximately one-half the magnitude of the second intermediate current $I_{I2}$, the remaining current required by transistor Q94 is provided by the comparison current $I_{COM}$.

In addition, as shown in FIGS. 1A and 1B, the third intermediate current $I_{I3}$ is sourced as the excess current which is not required by transistor Q94. As described in greater detail below, when the input voltage $V_{IN}$ is approximately equal to the output voltage $V_{OUT}$, the magnitude of the comparison current $I_{COM}$ is approximately equal to the magnitude of the first intermediate current $I_{I1}$. As a result, the magnitude of the third intermediate current $I_{I3}$ is very small because transistor Q94 is sinking substantially all of the first intermediate current $I_{I1}$.

However, as is further described in greater detail below, as the input voltage $V_{IN}$ varies with respect to the output voltage $V_{OUT}$, the magnitude of the comparison current $I_{COM}$ increases. As a result, less of the first intermediate current $I_{I1}$ is required to satisfy transistor Q94. This, in turn, increases the magnitude of the third intermediate current $I_{I3}$. As a result, variations in the magnitude of the comparison current $I_{COM}$ cause variations in the magnitude of the third intermediate current $I_{I3}$.

Third current stage 124 sinks the control current $I_C$ in response to a first reference voltage $V_{REF1}$, and varies the magnitude of the control current $I_C$ in response to changes in the magnitude of the third intermediate current $I_{I3}$. Thus, in accordance with the present invention, the magnitude of the comparison current $I_{COM}$ controls the magnitude of the control current $I_C$ which, in turn, controls the magnitude of the first and second output currents $I_{O1}$ and $I_{O2}$.

As shown in FIGS. 1A and 1B, stage 124 includes n-channel transistors Q113, Q80, and Q84, and a junction capacitor/diode D2. In operation, transistor Q80 is biased in the active region by transistors Q114 and Q94 so that transistor Q80 sources an emitter current which flows into the base of transistor Q84 and through resistor R6. The voltage drop across resistor R6, in turn, biases transistor Q84 in the active region. The first reference voltage $V_{REF1}$ biases transistor Q113 in the active region so that the control current $I_C$ is sunk through transistors Q113 and Q84 via resistors R4 and R5 to ground.

When the third intermediate current $I_{I3}$ increases, the increased current increases the base current into transistor Q80 which, in turn, increases the magnitude of the emitter current sourced by transistor Q80. This, in turn, increases the voltage drop across resistor R6 which turns on transistor Q84 harder, thereby increasing the magnitude of the control current $I_C$ sunk through transistors Q113 and Q84 via resistors R4 and R5.

As described in greater detail below, the first reference current $I_{REF1}$ not only sets the magnitude of the first and second intermediate currents $I_{I1}$ and $I_{I2}$, but also indirectly sets the magnitude of the comparison current $I_{COM}$. Thus, when the input voltage $V_{IN}$ equals the output voltage $V_{OUT}$, the magnitude of the first and second output currents $I_{O1}$ and $I_{O2}$ at the quiescent level is dependent only on the magnitude of the first reference current $I_{REF1}$.

In the circuit shown in FIGS. 1A and 1B, short circuit protection is achieved by limiting the magnitude of the first bias current $I_{B1}$ under fault conditions. Whenever a short to ground occurs at the output node $N_O$, one of the comparison stages discussed below, depending on the fault condition, turns the third current stage 124 completely on. This pulls the collector of transistor Q84 down to one base-emitter voltage drop above ground. The collector cannot go down any further to ground because of the junction capacitor/diode D2. If the collector attempts to go lower, the capacitor/diode D2 will turn on and hold the voltage at the collector up. The maximum voltage that can be developed across resistors R4 and R5 is the first reference, voltage $V_{REF1}$ minus two base-emitter voltage drops. This defines the maximum magnitude of the first bias current $I_{B1}$ which, in turn, limits the maximum magnitude of the first and second output currents $I_{O1}$ and $I_{O2}$.

In addition, whenever a short to the power supply occurs at the output node $N_O$ and the input voltage $V_{IN}$ is pulled to ground, as in a closed-loop system, diode D1 prevents the difference between the input voltage $V_{IN}$ and the output voltage $V_{OUT}$ from exceeding the voltage drop across diode D1. Without diode D1, the emitter-base junction of transistor Q101 will break when the output node $N_O$ is shorted to the power supply and the input voltage $V_{IN}$ is pulled to ground, thereby allowing an unlimited current flow through transistors Q101 and 78 to ground.

As shown in FIGS. 1A and 1B, driver 100 further includes a reference stage 126 that generates a reference stage voltage $V_{RS}$ at a third intermediate node $N_{I3}$ in response to a second reference current $I_{REF2}$ at the third intermediate node $N_{I3}$, the first bias current $I_{B1}$, and the first intermediate voltage $V_{I1}$. The difference between the first intermediate voltage $V_{I1}$ and the reference stage voltage $V_{RS}$ defines a third difference voltage.

Reference stage 126 includes an n-channel transistor Q175 that has its base connected to the first intermediate node $N_{I1}$, its emitter connected to the second reference current $I_{REF2}$ via the third intermediate node $N_{I3}$, and its collector connected to the power supply Vcc. Thus, as shown in FIGS. 1A and 1B, the third difference voltage represents the voltage drop across the base-emitter junction of transistor Q175.

Driver 100 also includes a first comparison stage 128 that sources a first comparison current $I_{COM1}$, and that compares the first difference voltage to the third difference voltage. In addition, stage 128 increases the magnitude of the first comparison current $I_{COM1}$ when the first difference voltage differs from the third difference voltage, and the magnitude of the second output current $I_{O2}$ is greater than the quiescent level. As shown in FIGS. 1A and 1B, stage 128 includes p-channel transistors Q86, Q108, Q106, and Q89 which are connected together in a conventional differential pair configuration.

Similarly, driver 100 also includes a second comparison stage 130 that sources a second comparison current $I_{COM2}$, and that compares the second difference voltage to the third difference voltage. In addition, stage 130 increases the magnitude of the second comparison current $I_{COM2}$ when the second difference voltage differs from the third difference voltage, and the magnitude of the first output current $I_{O1}$ is greater than the quiescent level.

As also shown in FIGS. 1A and 1B, stage 130 includes p-channel transistor Q95, p-channel transistors Q112, Q77, Q87, and Q83, which are connected together in a conventional differential pair configuration, and n-channel transistors Q176 and Q174 which are connected together in a conventional totem-pole configuration. Further, as described in greater detail below, transistors Q83 and Q89 mirror the current sunk through transistor Q82 so that the magnitude of the comparison current $I_{COM}$ will be approximately equal to the magnitude of the first intermediate current $I_{I1}$ when the input voltage $V_{IN}$ and the output voltage $V_{OUT}$ are approximately equal.

In operation, transistor Q108 sources the first comparison current $I_{COM1}$ while transistor Q77 sources the second comparison current $I_{COM2}$. The comparison current $I_{COM}$ is formed by summing together the first and second comparison currents $I_{COM1}$ and $I_{COM2}$.

When the input voltage $V_{IN}$ is approximately equal to the output voltage $V_{OUT}$, the voltage drops across the base-emitter junctions of transistors 101, 103, Q78, and Q175 are substantially equal. As a result, the magnitudes of the comparison currents $I_{COM1}$ and $I_{COM2}$ sourced by transistors Q108 and Q77, respectively, are approximately equal. The comparison current $I_{COM}$, in turn, is approximately equal to the first intermediate current $I_{I1}$. As a result, the magnitude of the third intermediate current $I_{I3}$ is at its minimum level, while the first and second output currents $I_{O1}$ and $I_{O2}$ are at the quiescent levels.

As stated above, as the input voltage $V_{IN}$ begins to increase with respect to the output voltage $V_{OUT}$, the magnitude of the first intermediate voltage $V_{I1}$ and of the first bias current $I_{B1}$ begin to increase, while the magnitude of the second intermediate voltage $V_{I2}$ and of the second bias current $I_{B2}$ begin to decrease. This, in turn, increases the voltage drop across the base-emitter junction of transistor Q101, thereby increasing the magnitude of the first output current $I_{O1}$, while decreasing the voltage drop across the base-emitter junction of transistor Q103, thereby decreasing the magnitude of the second output current $I_{O2}$.

As the voltage drop across the base-emitter junction of transistor Q101 begins to increase, the voltage drop across the base-emitter junction of transistor Q106 also begins to increase. This, in turn, causes transistor Q106 to begin sinking substantially all of the current sourced by transistor Q89, thereby reducing the magnitude of the first comparison current $I_{COM1}$ sourced by transistor Q108.

At the same time, as the voltage drop across the base-emitter junction of transistor Q103 begins to decrease, the voltage drop across the base-emitter junction of transistor Q176 also begins to decrease. As the voltage drop across the base-emitter junction of transistor Q176 begins to decrease, the voltage drop across the base-emitter junction of transistor Q174 begins to decrease. Thus, transistor Q174 mirrors the voltage drop across the base-emitter junction of transistor Q103 which, as noted above, represents the second difference voltage. As shown, transistor Q99 provides a small pull-up current which speeds up the response.

Second comparison stage 130 compares the voltage drops across the base-emitter junctions of transistor Q175, which represents the third difference voltage, and transistor Q174, which represents the second difference voltage. When the voltage drop across the base-emitter junction of transistor Q175 becomes larger than the voltage drop across the base-emitter junction of transistor Q174, this voltage difference indicates that the magnitude of the second output current $I_{O2}$ is less than a first predetermined level. The first predetermined level defines a current magnitude which is less than the quiescent level, but large enough to keep transistor Q103 from turning off.

In response to this voltage difference, transistor Q77 begins sourcing at least twice the second comparison current $I_{COM2}$ that it previously sourced. As the voltage difference continues to increase, the magnitude of the second comparison current $I_{COM2}$ sourced by transistor Q77 also increases. As stated above, increases in the comparison current $I_{COM}$ cause the third intermediate current $I_{I3}$, the control current $I_C$, and the first bias current $I_{B1}$ to increase.

Second comparison current $I_{COM2}$ and first bias current $I_{B1}$, which is sourced by transistor Q105, will continue to increase until there is enough drive to allow transistor Q101 to source as much current to the load as is required, and to maintain the magnitude of the second output current $I_{O2}$ sunk by transistor Q103 at the first predetermined level. As a result, when the first output stage 112 is sourcing current to the load, the second comparison stage 130 insures that transistor Q103 is never allowed to turn off.

In the same manner, if the magnitude of the second output current $I_{O2}$ sourced by transistor Q103 is greater than the first predetermined level, then the base-emitter voltage of transistor Q174 will be greater than the base-emitter voltage of transistor Q175. This voltage difference causes the magnitude of the comparison current $I_{COM2}$ sourced by transistor Q77 to be reduced. This, in turn, decreases the magnitude of the first bias current $I_{B1}$, thereby reducing the magnitude of the second output current $I_{O2}$, until the base-emitter voltage of transistor Q174 matches the base-emitter voltage of transistor Q175.

On the other hand, as also stated above, as the input voltage $V_{IN}$ begins to decrease with respect to the output voltage $V_{OUT}$, the magnitude of the first intermediate voltage $V_{I1}$ and the first bias current $I_{B1}$ begin to decrease, while the magnitude of the second intermediate voltage $V_{I2}$ and the second bias current $I_{B2}$ begin to increase. This, in turn, increases the voltage drop across the base-emitter junction of transistor Q103, thereby increasing the magnitude of the second output current $I_{O2}$, while decreasing the voltage drop across the base-emitter junction of transistor Q101, thereby decreasing the magnitude of the first output current $I_{O1}$.

As the voltage drop across the base-emitter junction of transistor Q103 begins to increase, the voltage drop across the base-emitter junction of transistor Q176 begins to increase. As the voltage drop across the base-emitter junction of transistor Q176 begins to increase, the voltage drop across the base-emitter junction of transistor Q174 begins to increase. This, in turn, causes transistor Q87 to begin sinking substantially all of the current sourced by transistor Q83, thereby reducing the second comparison current $I_{COM2}$ sourced by transistor Q77.

First comparison stage 128 compares the base-emitter voltage drops of transistor Q175, which represents the third difference voltage, and transistor Q101, which represents the first difference voltage. When the base-emitter voltage drop of transistor Q175 becomes larger than the base-emitter voltage drop of transistor Q101, this difference indicates that the magnitude of the first output current $I_{O1}$ is less than a second predetermined level. The second predetermined level defines a current magnitude which is less than the quiescent level, but large enough to keep transistor Q101 from turning off. In the preferred embodiment, the first and second predetermined levels are substantially equal.

In response to this voltage difference, transistor Q108 begins sourcing at least twice the first comparison current $I_{COM1}$ that it previously sourced. As the voltage difference continues to increase, the magnitude of the first comparison current $I_{COM1}$ sourced by transistor Q108 also increases. As stated above, increases in the comparison current $I_{COM}$ cause the third intermediate current $I_{I3}$, the control current $I_C$, and the first bias current $I_{B1}$ to increase.

First comparison current $I_{COM1}$ and first bias current $I_{B1}$, which is sourced by transistor Q105, continue to increase until there is enough drive to allow transistor Q103 to sink as much current from the load as is required, and to maintain the magnitude of the first output current $I_{O1}$ sourced by transistor Q101 at the second predetermined level. As a result, when the second output stage 114 is sinking current from the load, the first comparison stage 128 insures that transistor Q101 is never allowed to turn off.

In the same manner, if the magnitude of the first output current $I_{O1}$ sourced by transistor Q101 is greater than the second predetermined level, then the base-emitter voltage of transistor Q101 will be greater than the base-emitter voltage of transistor Q175. This voltage difference causes the magnitude of the first comparison current $I_{COM1}$ sourced by transistor Q108 to be reduced. This, in turn, decreases the magnitude of the first bias current $I_{B1}$, thereby reducing the magnitude of the first output current $I_{O1}$, until the base-emitter voltage of transistor Q101 matches the base-emitter voltage of transistor Q175.

The principle advantage behind insuring that transistor Q101 continues to source a low quiescent current when transistor Q103 is controlling, and that transistor Q103 continues to source a low quiescent current when transistor Q101 is controlling, is that this vastly reduces the cross-over distortion between the first output current $I_{O1}$ and the second output current $I_{O2}$.

The present invention provides a number of advantages in addition to providing a low quiescent current when there is little or no demand for current, and a substantially larger current which can be quickly increased when there is a significant demand for current. First, the driver 100 can provide a voltage swing which, at the bottom, is only limited by the base drive needed to put transistor Q103 into hard saturation.

In addition, driver 100 is self-regulating. Thus, if the output voltage $V_{OUT}$ moves, driver 100 will insure that the output voltage $V_{OUT}$ remains equal to the input voltage $V_{IN}$. For example, if the output voltage $V_{OUT}$ were to increase for some reason, transistor Q101 begins to turn off while transistor Q103 begins to turn on, thereby pulling the output voltage $V_{OUT}$ back to its original position.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. An adaptive-output current driver for sourcing current to and sinking current from a load so that the voltage across the load follows an input voltage, the adaptive output driver comprising:

an input stage that changes the magnitude of a first intermediate voltage at a first intermediate node, and the magnitude of a second intermediate voltage at a second intermediate node in response to changes in the magnitude of the input voltage, that sources a first bias current into the first intermediate node and a second bias current into the second intermediate node, and that varies the magnitude of the first bias current and the second bias current in response to changes in the magnitude of a control current and the input voltage;

a first output stage connected to the first intermediate node that sources a first output current to an output node, and that varies the magnitude of the first output current in response to a difference between the first intermediate voltage and an output voltage at the output node, and the magnitude of the first bias current, the difference between the first intermediate voltage and the output voltage defining a first difference voltage;

a second output stage connected to the second intermediate node that sinks a second output current from the output node, and that varies the magnitude of the second output current in response to a difference between the second intermediate voltage and the output voltage, and the magnitude of the second bias current, the difference between the second intermediate voltage and the output voltage defining a second difference voltage;

a current control stage that sinks the control current from the input stage, and that sets the magnitude of the control current in response to the magnitude of a comparison current;

a reference stage connected to the first intermediate node that generates a reference stage voltage at a reference node in response to the first bias current, the first intermediate voltage, and a reference current, the difference between the first intermediate voltage and the reference stage voltage defining a third difference voltage;

a first comparison stage connected to the reference stage, the current control stage, the first output stage, and the second output stage, that sources a first portion of the comparison current, that compares the first difference voltage to the third difference voltage, and that varies the magnitude of the first portion of the comparison current when the first difference voltage differs from the third difference voltage, and the magnitude of the second output current is greater than a first predetermined level; and a second comparison stage connected to the reference stage, the current control stage, the first output stage, and the second output stage, that sources a second portion of the comparison current, that compares the second difference voltage to the third difference voltage, and that varies the magnitude of the second portion of the comparison current when the second difference voltage differs from the third difference voltage, and the magnitude of the first output current is greater than a second predetermined level, the comparison current being defined by the first portion and the second portion of the comparison current.

2. The driver of claim 1 wherein the input stage includes:

an input transistor having a base connected to the input voltage, an emitter connected to the first intermediate node that sinks a portion of the first bias current, and a collector connected to the second intermediate node that sources the second bias current; and a current mirror connected to the first intermediate node that mirrors the control current to source the first bias current into the first intermediate node.

3. The driver of claim 1 wherein the first output stage includes a first output transistor, and the second output stage includes a second output transistor, the first output transistor and the second output transistor being connected together in a push-pull configuration.

4. The driver of claim 1 wherein the current control stage includes:

a first current stage that sources a first intermediate current and a second intermediate current in response to a reference current, the first intermediate current having a magnitude that is approximately one-half the magnitude of the second reference current;

a second current stage that sources a third intermediate current in response to the first intermediate current, the second intermediate current, and the comparison current, the magnitude of the third intermediate current varying in response to variations in the magnitude of the comparison current; and a third current stage that sinks the control current in response to a first reference voltage, and that varies the magnitude of the control current in response to variations in the magnitude of the third intermediate current.

5. The driver of claim 1 wherein the reference stage includes a reference transistor having a base connected to the first intermediate node, a collector connected to a power supply, and an emitter connected to the reference current.

6. The driver of claim 1 wherein the first comparison stage includes a differential pair stage having a pair of first outputs connected to the reference stage, a second output connected to the output node, a third output connected to the current control stage, and a fourth output connected to the current control stage that sources the first portion of the comparison current.

7. The driver of claim 4 wherein the first comparison stage includes a differential pair stage having a pair of first outputs connected to the reference stage, a second output connected to the output node, a third output connected to the first current stage, and a fourth output connected to the second current stage that generates the first portion of the comparison current.

8. The driver of claim 7 wherein the differential pair stage includes a current source connected to the third output that generates a differential current in response to the reference current.

9. The driver of claim 1 wherein the second comparison stage includes:

a differential pair stage having a pair of first outputs connected to the reference stage, a second output, a third output connected to the current control stage, and a fourth output connected to the current control stage that sources the second portion of the comparison current; and a totem pole stage having a first input connected to the second output of the differential pair stage, a second input connected to the first intermediate node, and a third input connected to the second intermediate node.

10. The driver of claim 4 wherein the second comparison stage includes:

a differential pair stage having a pair of first outputs connected to the reference stage, a second output, a third output connected to the first current stage, and a fourth output connected to the second current stage that sources the second portion of the comparison current; and a totem pole stage having a first input connected to the second output of the differential pair stage, a second input connected to the first intermediate node, and a third input connected to the second intermediate node.

11. The driver of claim 10 wherein the differential pair stage includes a current source connected to the third output of the differential pair stage that generates a differential current in response to the reference current.

12. A method for sourcing current to and sinking current from a load so that the voltage across the load follows an input voltage, the method comprising the steps of:

providing a first output transistor that sources a first output current to an output node when the input voltage is greater than an output voltage at the output node;

providing a second output transistor that sinks a second output current from the output node when the input voltage is less than the output voltage at the output node;

sensing the magnitude of the first output current when the magnitude of the first output current is less than the magnitude of the second output current; and increasing the magnitude of the first output current and the second output current when the magnitude of the first output current falls below a predetermined level.

13. A method for sourcing current to and sinking current from a load so that the voltage across the load follows an input voltage, the method comprising the steps of:

providing a first output transistor that sources a first output current to an output node when the input voltage is greater than an output voltage at the output node;

providing a second output transistor that sinks a second output current from the output node when the input voltage is less than the output voltage at the output node;

sensing the magnitude of the second output current when the magnitude of the first output current is greater than the magnitude of the second output current; and increasing the magnitude of the first output current and the second output current when the magnitude of the second output current falls below a predetermined level.

14. An adaptive-output current driver for sourcing current to and sinking current from a load so that the voltage across the load follows an input voltage, the driver comprising:

first output means for sourcing a first output current to an output node wherein the magnitude of the first output current exceeds a first quiescent level when the input voltage is greater than an output voltage at the output node, and wherein the magnitude of the first output current falls below the first quiescent level when the input voltage is less than the output voltage at the output node;

second output means for sinking a second output current from the output node wherein the magnitude of the second output current exceeds a second quiescent level when the input voltage is less than the output voltage at the output node, and wherein the magnitude of the second output current falls below the second quiescent level when the input voltage is greater than the output voltage at the output node;

first sensing means for sensing the magnitude of the first output current when the magnitude of the first output current is less than the magnitude of the second output current; and first current means for preventing the magnitude of the first output current from falling below a first predetermined level, and increasing the magnitude of the second output current when the magnitude of the first output current is approximately equal to the first predetermined level.

15. The driver of claim 14 and further comprising:

second sensing means for sensing the magnitude of the second output current when the magnitude of the first output current is greater than the magnitude of the second output current; and second current means for preventing the magnitude of the second output current from falling below a second predetermined level, and increasing the magnitude of the first output current when the magnitude of the second output current is approximately equal to the second predetermined level.

16. The driver of claim 15 wherein the first quiescent level is substantially equal to the second quiescent level.

17. The driver of claim 15 wherein the first predetermined level defines a current magnitude that is less than the first quiescent level.

18. The driver of claim 15 wherein the second predetermined level defines a current magnitude that is less than the second quiescent level.

* * * * *